(12) United States Patent
Bando et al.

(10) Patent No.: US 11,132,254 B2
(45) Date of Patent: Sep. 28, 2021

(54) SEMICONDUCTOR INTEGRATED CIRCUIT, STORAGE DEVICE, AND ERROR CORRECTION METHOD

(71) Applicant: LAPIS Semiconductor Co., Ltd., Yokohama (JP)

(72) Inventors: Kazuhiko Bando, Yokohama (JP); Satoshi Miyazaki, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 56 days.

(21) Appl. No.: 16/392,230

(22) Filed: Apr. 23, 2019

(65) Prior Publication Data

US 2019/0324852 A1 Oct. 24, 2019

(30) Foreign Application Priority Data

Apr. 24, 2018 (JP) .................. JP2018-82840

(51) Int. Cl.
*G11C 29/00* (2006.01)
*G06F 11/10* (2006.01)
*G11C 29/52* (2006.01)

(52) U.S. Cl.
CPC ...... *G06F 11/1068* (2013.01); *G06F 11/1004* (2013.01); *G11C 29/52* (2013.01)

(58) Field of Classification Search
None
See application file for complete search history.

(56) References Cited

U.S. PATENT DOCUMENTS

| 4,661,955 | A | * | 4/1987 | Arlington | ............ | G06F 11/1028 |
| | | | | | | 714/52 |
| 7,774,684 | B2 | * | 8/2010 | Bains | .................. | G06F 11/1008 |
| | | | | | | 714/766 |
| 10,331,514 | B2 | * | 6/2019 | Kaynak | ............... | G06F 11/1012 |
| 10,439,648 | B1 | * | 10/2019 | Khayat | ............. | H03M 13/1575 |
| 2007/0226588 | A1 | * | 9/2007 | Lee | ........................ | H03M 13/09 |
| | | | | | | 714/758 |
| 2011/0185251 | A1 | * | 7/2011 | d'Abreu | ............. | G06F 11/1072 |
| | | | | | | 714/752 |

(Continued)

FOREIGN PATENT DOCUMENTS

JP 2009-152781 A 7/2009
JP 2014-022848 A 2/2014

*Primary Examiner* — Guerrier Merant
(74) *Attorney, Agent, or Firm* — Rabin & Berdo, P.C.

(57) ABSTRACT

A semiconductor integrated circuit reads data from a memory, which stores the data including a data portion and a parity bit, and makes an error correction to the data. The semiconductor integrated circuit includes a memory controller for reading the data from the memory; and an error correction controller having an error correction circuit having the ability to correct a predetermined number of bits of errors. The error correction controller applies an error correction to the read data by the error correction circuit, and determines whether all errors contained in the data are corrected, based on the data portion and the parity bit of the data after the error correction. When not all the errors contained in the data are determined to be corrected, the error correction controller applies an error correction by the error correction circuit, while sequentially inverting the data value of each bit of the data.

9 Claims, 10 Drawing Sheets

(56) References Cited

U.S. PATENT DOCUMENTS

| | | | | |
|---|---|---|---|---|
| 2014/0164878 A1* | 6/2014 | Tam | ................... | G06F 11/1012 |
| | | | | 714/773 |
| 2017/0257121 A1* | 9/2017 | Kwok | ................. | G06F 11/1012 |
| 2018/0074892 A1* | 3/2018 | Shappir | ............... | H03M 13/451 |
| 2018/0076828 A1* | 3/2018 | Kanno | ................... | G11C 16/10 |

* cited by examiner

SEMICONDUCTOR INTEGRATED CIRCUIT, STORAGE DEVICE, AND ERROR CORRECTION METHOD

CROSS-REFERENCE TO RELATED APPLICATIONS

This application is based upon and claims the benefit of priority from the prior Japanese Patent Application No. 2018-82840 filed on Apr. 24, 2018, the entire contents of which are incorporated herein by reference.

FIELD

Embodiments described herein relate to a semiconductor integrated circuit that applies an error correction to data, and an error correction method.

BACKGROUND

Error correction circuits are widely used in various systems that treat data. For example, when data stored in a device is transferred to another device through a communication path, errors such as garbled bits sometimes occur. To correct the garbled bits occurring in the transfer, an error correction circuit is often installed in the device. The garbled bits occur not only in transferring data but also in storing or reading data in or from a recording medium such as a memory. Accordingly, there are proposed error correction circuits that applies corrections to data to be stored in memories such as flash memories using coding means such as a BCH code (for example, Japanese Patent Application Laid-Open Nos. 2014-22848 and 2009-152781).

The correction ability (in other words, how many garbled bits can be corrected) of the error correction circuit depends on the size of a circuit that is able to be installed in the device. Thus, there is a problem that a device that can install only a circuit of a small size has no other choice but to adopt an error correction circuit having a low correction ability. Even if an error correction circuit of a large size can be installed, there is still a problem that, to improve its correction ability, the error correction circuit is required to be redesigned from the beginning.

Considering the problems described above, it is aimed at providing a semiconductor integrated circuit including an error correction circuit, and more specifically a semiconductor integrated circuit that can correct errors the number of bits of which exceeds the correction ability of the error correction circuit.

DETAILED DESCRIPTION

Figure 1:
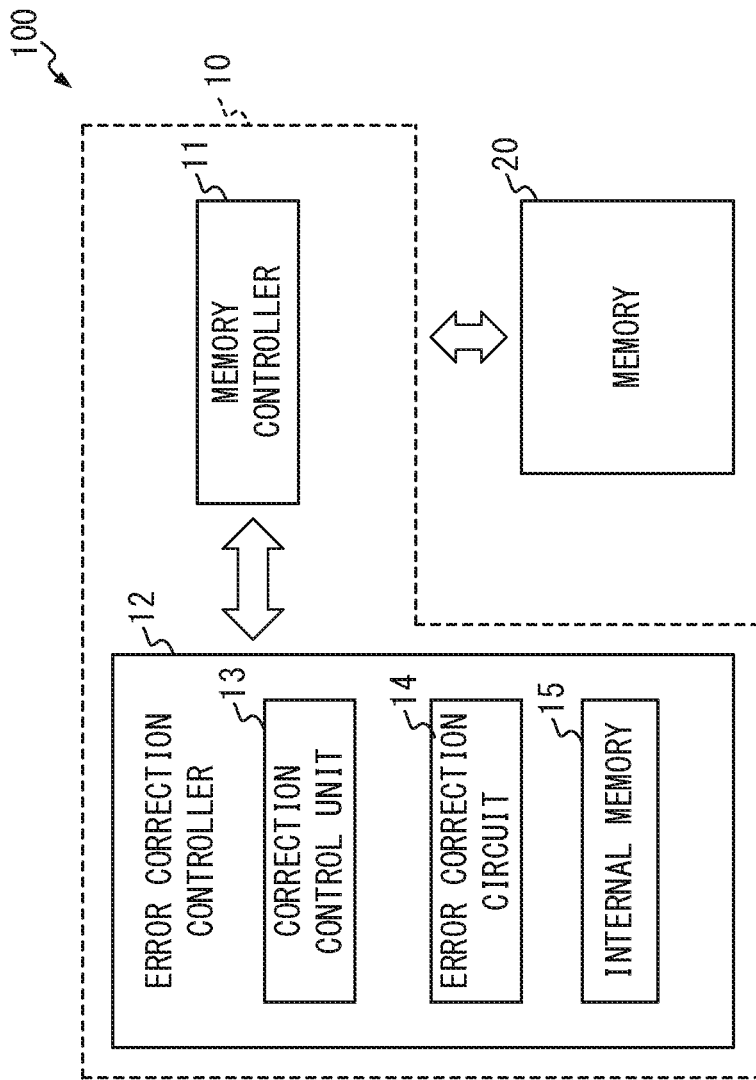
FIG. 1 is a block diagram illustrating a configuration of a storage device including a semiconductor integrated circuit according to a present embodiment.

A semiconductor integrated circuit according to embodiments is connected to a memory that stores data including a data portion and a parity bit corresponding to the data portion. The semiconductor integrated circuit reads the data from the memory and applies an error correction to the data. The semiconductor integrated circuit includes a memory controller configured to read the data from the memory; and an error correction controller configured to include an error correction circuit having the ability to correct a predetermined number of bits of errors, and to apply an error correction to the data read from the memory. The error correction controller applies an error correction to the data read from the memory, by the error correction circuit, and determines whether or not all errors contained in the data are corrected, on the basis of the data portion and the parity bit of the data after the error correction. When not all the errors contained in the data are determined to be corrected, the error correction controller applies an error correction to said data by the error correction circuit, while sequentially inverting the data value of each bit of the data.

A storage device according to the embodiments includes a memory configured to store data including a data portion and a parity bit corresponding to the data portion; a memory controller configured to read the data from the memory; and an error correction controller configured to include an error correction circuit having the ability to correct a predetermined number of bits of errors, and to applies an error correction to the data read from the memory. The error correction controller applies an error correction to the data read from the memory, by the error correction circuit, and determines whether or not all errors contained in the data are corrected, on the basis of the data portion and the parity bit of the data after the error correction. When not all the errors contained in the data are determined to be corrected, the error correction controller applies an error correction by the error correction circuit, while sequentially inverting the data value of each bit of the data.

An error correction method according to the embodiments is performed by a semiconductor integrated circuit that includes an error correction circuit having the ability to correct a predetermined number of bits of errors. The semiconductor integrated circuit reads data from a memory configured to store the data including a data portion and a parity bit corresponding to the data portion, and applies an error correction thereto. The error correction method includes the steps of reading the data from the memory; making an error correction to the data read from the memory, by the error correction circuit; generating a new parity bit on the data portion of the data after the error correction; comparing the new parity bit with the party bit on the data after the error correction, to determine whether or not all errors contained in the data are corrected; and when not all the errors contained in the data are determined to be corrected, making an error correction by the error correction circuit, while sequentially inverting the data value of each bit of the data.

An error correction method according to the embodiments is performed by a semiconductor integrated circuit that includes an error correction circuit having the ability to correct a predetermined number of bits of errors. The semiconductor integrated circuit reads data and CRC data from a memory configured to store the data including a data portion and a parity bit corresponding to the data portion and the CRC data including a CRC code corresponding to the data portion and a parity bit corresponding to the CRC code, and applies an error correction thereto. The error correction method includes the steps of reading the data and the CRC data from the memory; applying an error correction to the data read from the memory, by using the error correction circuit; applying an error correction to the CRC data read from the memory; generating a new CRC code on the data portion of the data after the error correction; and comparing the new CRC code with the CRC code of the CRC data after the error correction, to determine whether or not the error correction is precisely made on the data.

According to the semiconductor integrated circuit of the embodiments, it is possible to correct errors the number of bits of which exceeds the correction ability of the error correction circuit.

Preferred embodiments will be described below in detail. Note that, in the following description and attached drawings of the embodiments, the same reference numerals indicate substantially the same or equivalent components.

First Embodiment

FIG. 1 is a block diagram that illustrates a configuration of a storage device 100 according to the present embodiment. The storage device 100 includes a memory controller 11, an error correction controller 12, and a memory 20. The memory controller 11 and the error correction controller 12 constitute a semiconductor integrated circuit 10 of one chip.

The memory controller 11 writes data to the memory 20 and reads data from the memory 20. The memory controller 11 supplies the data read from the memory 20 to the error correction controller 12.

The error correction controller 12 is a circuit that applies an error correction to data read from the memory 20 by the memory controller 11. To be more specific, the error correction controller 12 corrects bit errors (so-called garbled bits) that occur in writing or reading of the data. The error correction controller 12 includes a correction control unit 13, an error correction circuit 14, and an internal memory 15.

The correction control unit 13 is a control circuit that controls the error correction circuit 14 to make an error correction. The correction control unit 13 performs data processing including generation of a parity bit on data read from the memory 20, comparison of data and the like.

The error correction circuit 14 is a circuit to apply an error correction (in other words, a garbled bit correction) to data read from the memory 20. The error correction circuit 14 makes the error correction using, for example, a BCH coding method. The error correction circuit 14 has the ability to correct a predetermined number of bits of errors, which is determined by the error correction method and the size (byte number) of a parity bit accompanying the data.

The internal memory 15 is a volatile memory installed in the error correction controller 12. The internal memory 15 is used as a working area that temporarily stores data in error processing that the correction control unit 13 and the error correction circuit 14 perform.

The memory 20 is a non-volatile memory device composed of, for example, a NAND flash memory. The memory 20 stores a predetermined number of bits (for example, 16 bytes) of data and a parity bit generated on the basis of a BCH coding method, in correspondence with each other.

Figure 2A:
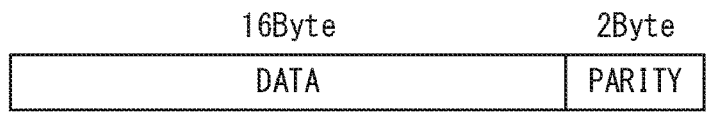
FIG. 2A is a drawing illustrating a data structure according to a first embodiment.

FIG. 2A is a drawing illustrating an example of the structure of data stored in the memory 20. The memory 20 stores 16-byte data accompanied with a 2-byte parity bit, as one piece of data. In the following description, the 16-byte data is referred to as a "data portion", and the entirety (18 bytes) of the data portion accompanied with the 2-byte parity bit is simply referred to as "data".

As described above, in the present embodiment, data is constituted of a 16-byte data portion and a 2-byte parity bit accompanying therewith. The error correction circuit 14 can correct up to 2 bits of errors of the 18-byte data. In other words, the error correction circuit 14 of the present embodiment has the ability to correct 2 bits of errors.

Next, the operation of error correction processing performed by the semiconductor integrated circuit 10 according to the present embodiment will be described with reference to a flowchart of FIGS. 3 and 4 and FIGS. 2A to 2F.

The memory controller 11 reads 18-byte data (a 16-byte data portion and a 2-byte parity bit) having the structure as illustrated in FIG. 2A from the memory 20 (STEP 101). The memory controller 11 supplies the read data to the error correction controller 12. The correction control unit 13 of the error correction controller 12 stores the read data in the internal memory 15.

Figure 2B:
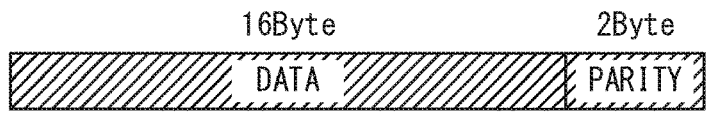
FIG. 2B a drawing of data and a parity bit after an error correction.

The correction control unit 13 controls the error correction circuit 14 to perform error correction processing on each of the data portion and the parity bit of the read data (STEP 102). In FIG. 2B, the read data after the error correction is indicated with shading.

Next, the correction control unit 13 controls the error correction circuit 14 to newly generate a 2-byte parity bit on the data portion (16 bytes) of the read data (hereinafter referred to as corrected data) after the error correction (STEP 103).

Figure 2C:
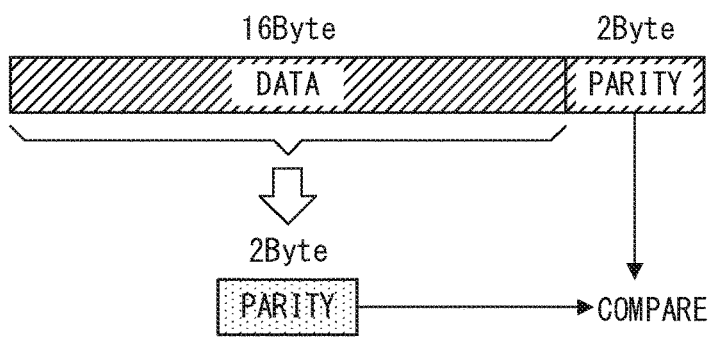
FIG. 2C is a drawing schematically illustrating a state of generating a parity bit on a data portion after the error correction, and a state of comparing the generated parity bit with the parity bit after the error correction.

The correction control unit 13 compares the parity bit that is newly generated in STEP 103 with the parity bit the error of which is corrected in STEP 102 (STEP 104). In FIG. 2C, the newly generated parity bit is indicated with dots, and the parity bit the error of which is corrected in STEP 102 is indicated with shading.

The correction control unit 13 determines whether or not the two parity bits coincide (STEP 105). When the parity bits are determined to coincide (YES in STEP 105), all errors contained in the read data are determined to be corrected, and the operation ends. When the parity bits are not determined to coincide (NO in STEP 105), it is determined that errors exceeding the correction ability of the error correction circuit 14 (i.e. more than 2 bits of errors in the present embodiment) are present, and the operation of the semiconductor integrated circuit 10 shifts to processing steps illustrated in the flowchart of FIG. 4.

Figure 2D:
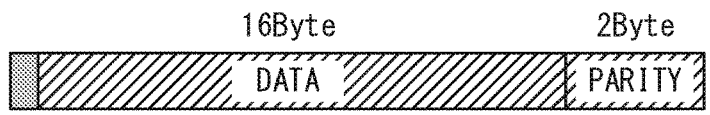
FIG. 2D is a drawing illustrating the data and the parity bit in which the value of one bit is inverted.

The correction control unit 13 inverts the value of a first one bit of the corrected data (STEP 201). FIG. 2D illustrates corrected data after the reversal of the value of the first one bit.

Figure 2E:
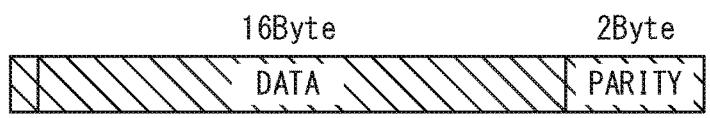
FIG. 2E is a drawing illustrating the data and the parity bit having the one bit of the inverted value after the error correction.

The correction control unit 13 controls the error correction circuit 14 to perform error correction processing on the corrected data after the reversal of the value of the first one bit (STEP 202). FIG. 2E illustrates data after the error correction in STEP 202.

The correction control unit 13 controls the error correction circuit 14 to newly generate a 2-byte parity bit on the data portion (16 bytes) of the data after the error correction in STEP 202 (in other words, data after the reversal of the bit and the correction) (STEP 203).

Figure 2F:
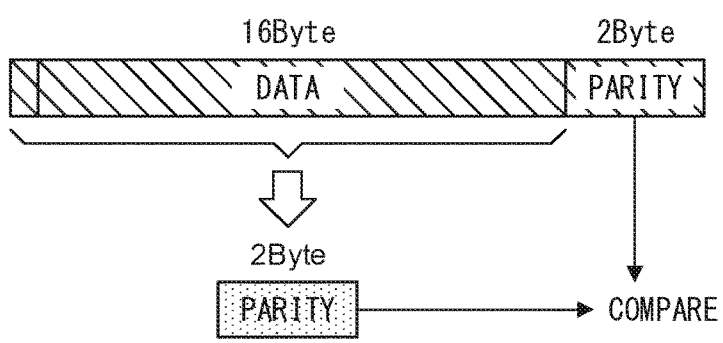
FIG. 2F is a drawing schematically illustrating a state of generating a parity bit on the data portion after the error correction, and a state of comparing the generated parity bit with the parity bit after the error correction.
Figure 3:
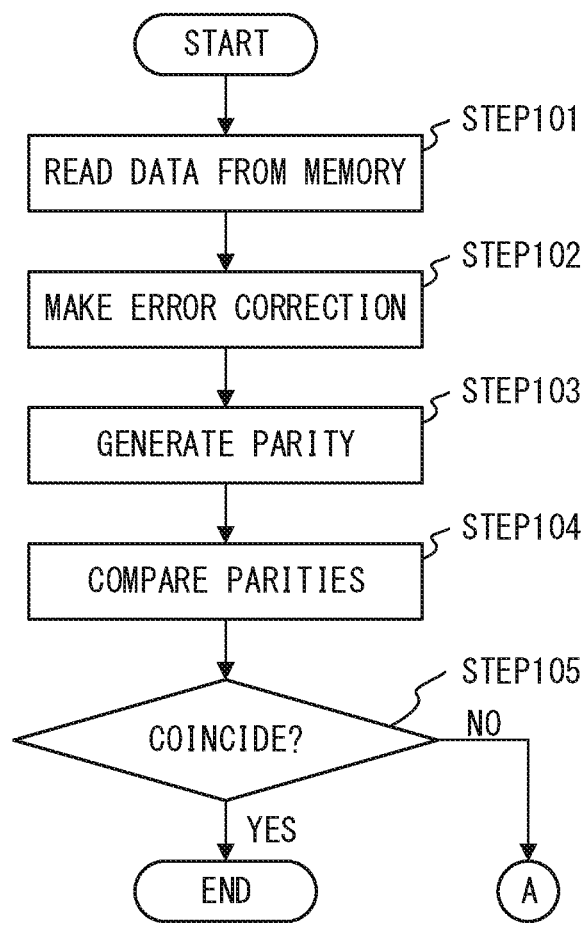
FIG. 3 is a flowchart of an error correction processing routine executed by a semiconductor integrated circuit according to the first embodiment.
Figure 4:
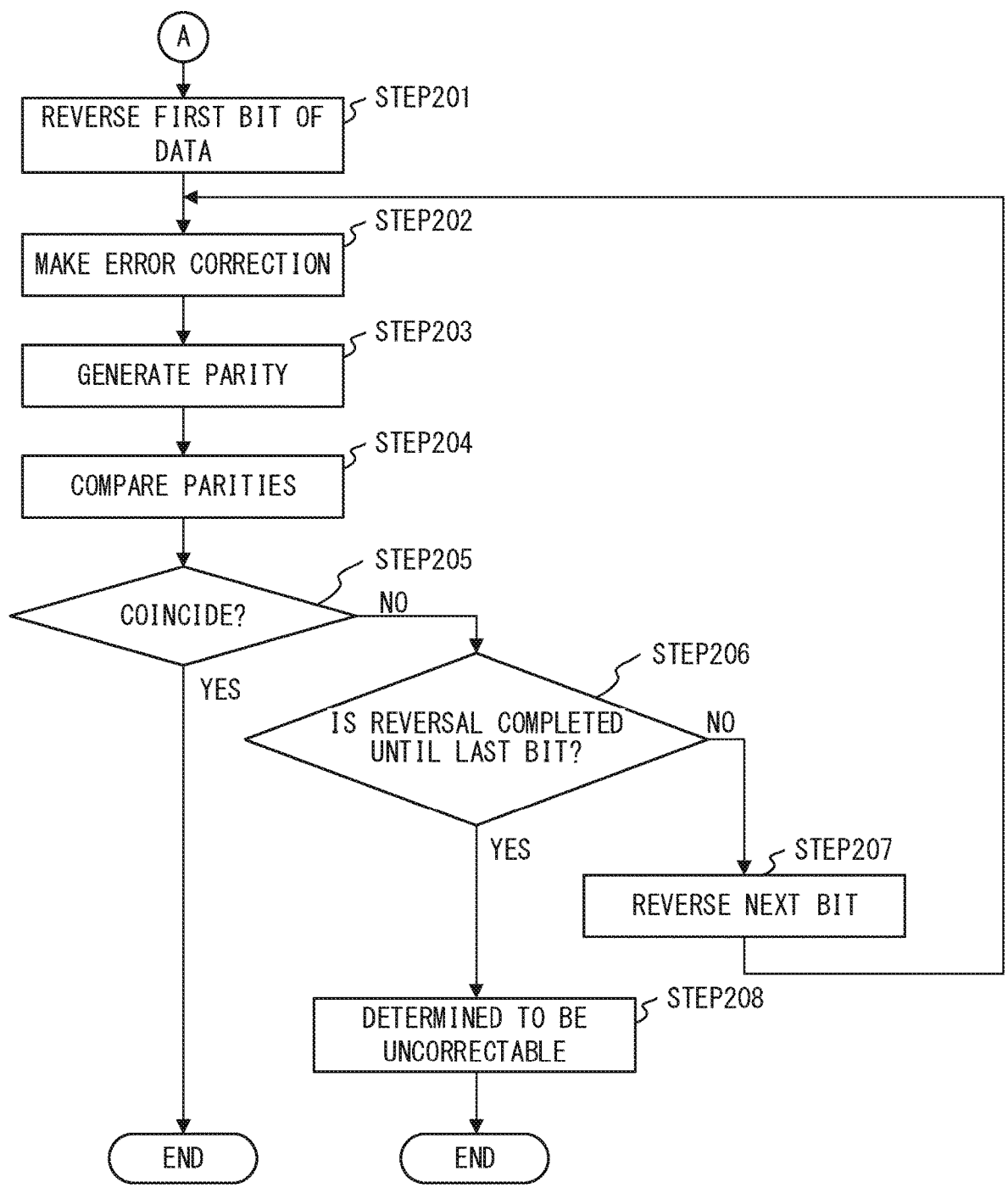
FIG. 4 is a flowchart of the error correction processing routine executed by the semiconductor integrated circuit according to the first embodiment.

The correction control unit 13 makes a comparison between the parity bit newly generated in STEP 203 and the parity bit after the error correction in STEP 202 (STEP 204). In FIG. 2F, the newly generated parity bit is indicated with dots, and the parity bit after the error correction in STEP 202 is indicated with shading.

The correction control unit 13 determines whether or not the two parity bits coincide (STEP 205). When the parity bits are determined to coincide (YES in STEP 205), all errors are determined to be corrected in STEP 202, and the operation ends.

On the other hand, when the parity bits are not determined to coincide (NO in STEP 205), the correction control unit 13 repeatedly performs STEP 202 to STEP 205, while shifting a bit the value of which is inverted until parity bits coincide or the reversal reaches the last bit. In other words, the correction control unit 13 determines whether or not the reversal of bits of the corrected data has proceeded to the last bit (STEP 206). When the reversal of bits has not proceeded to the last bit (NO in STEP 206), the value of the next bit is inverted and STEP 202 to STEP 205 are performed again. When the reversal of bits has proceeded to the last bit (YES in STEP 206), the correction control unit 13 determines that not all errors can be corrected because the number of bits of the errors exceeds the sum of the correction ability of the error correction circuit 14 and one bit corrected by the reversal (in other words, 3 bits in the present embodiment) (STEP 208), and the operation ends.

As described above, the semiconductor integrated circuit 10 according to the present embodiment makes a comparison between the parity bit on which the error correction is performed and the parity bit newly generated on the data after the error correction, and determines whether or not the parity bits coincide with each other, in order to determine whether or not all errors contained in the read data be corrected. When not all errors are determined to be corrected, the error correction is repeatedly performed while the bit value of the data is inverted on a one-by-one basis. According to the processing, even if data has errors (garbled bits) the number of which exceeds the correction ability of the error correction circuit 14 by one bit, the errors can be corrected precisely.

Accordingly, the semiconductor integrated circuit 10 according to the present embodiment can correct the bit errors exceeding the correction ability of the error correction circuit, without changing the design of the error correction circuit. As compared with the case of changing the design of the error correction circuit, it is possible to prevent an increase in the size of the circuit.

Second Embodiment

Next, a storage device according to a second embodiment will be described. The storage device according to the present embodiment has the same configuration as the storage device 100 according to the first embodiment illustrated in FIG. 1, but is different from the storage device 100 according to the first embodiment in a data structure stored in the memory 20 and in the operation of error correction processing performed by the error correction controller 12.

Figure 5:
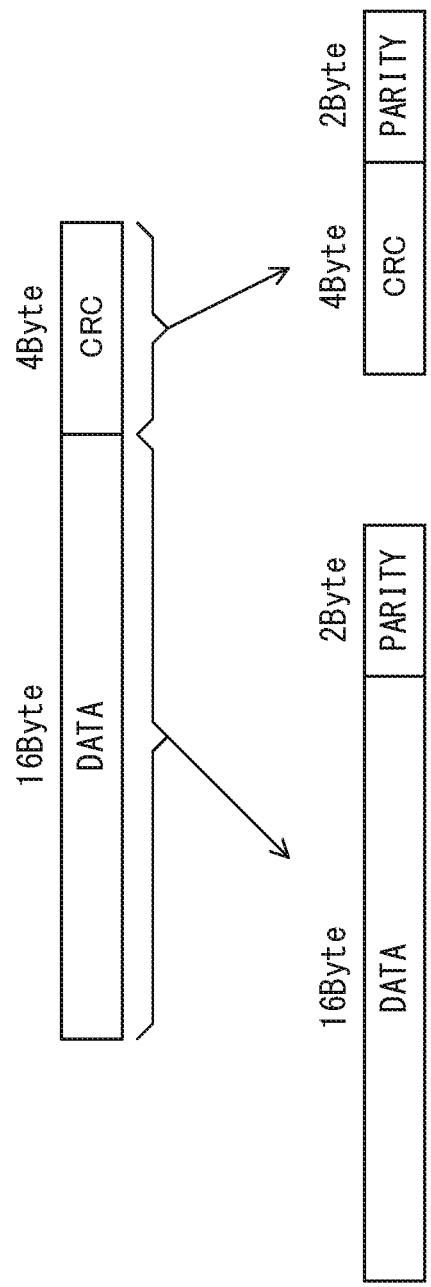
FIG. 5 is a drawing illustrating a data structure according to a second embodiment.
Figure 6:
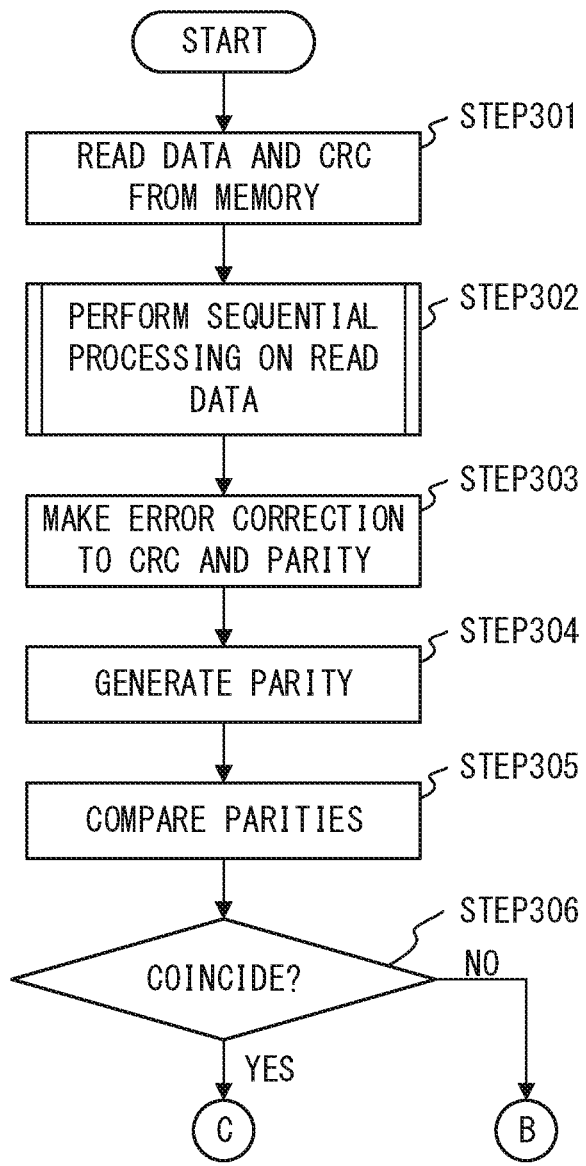
FIG. 6 is a flowchart of an error correction processing routine executed by a semiconductor integrated circuit according to the second embodiment.
Figure 7:
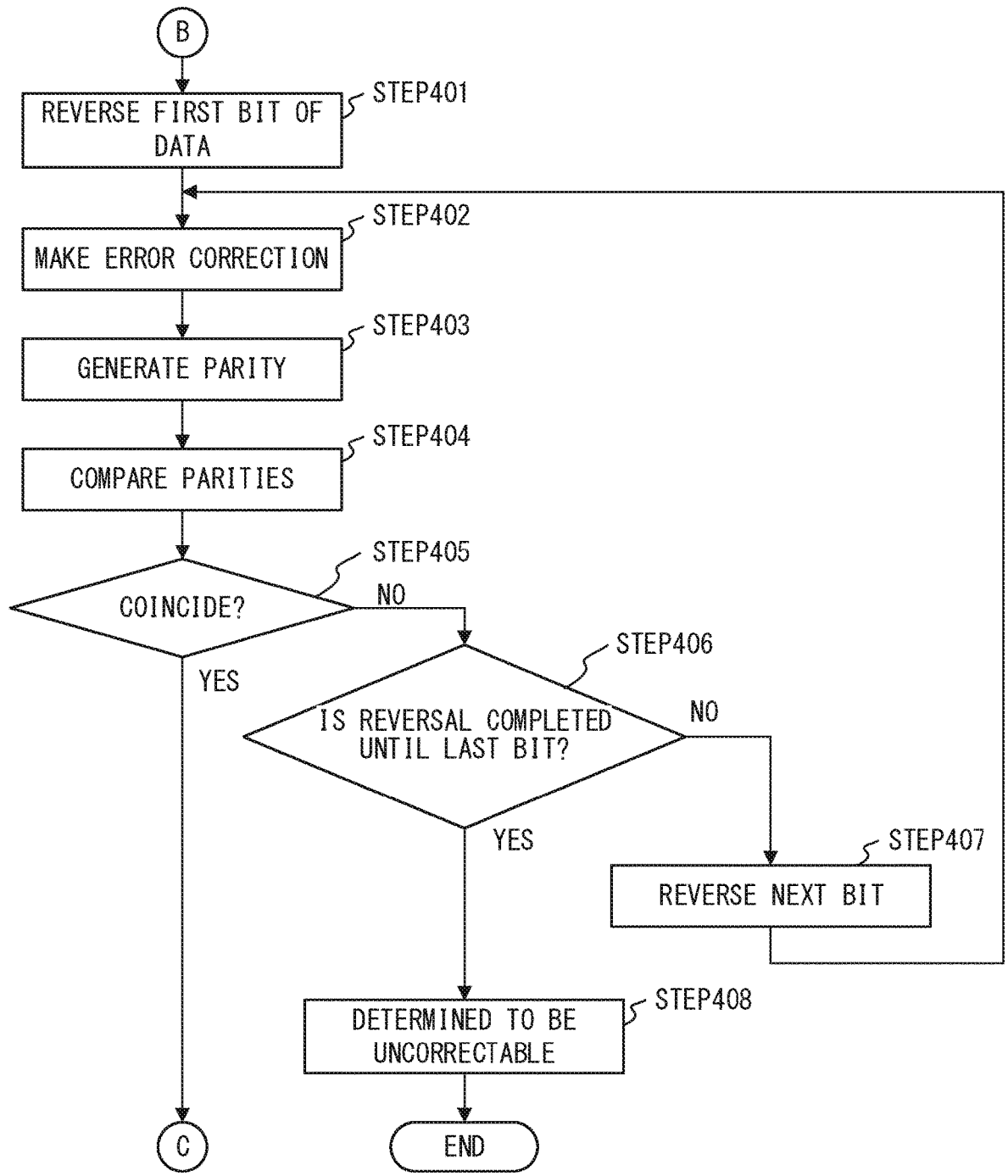
FIG. 7 is a flowchart of the error correction processing routine executed by the semiconductor integrated circuit according to the second embodiment.
Figure 8:
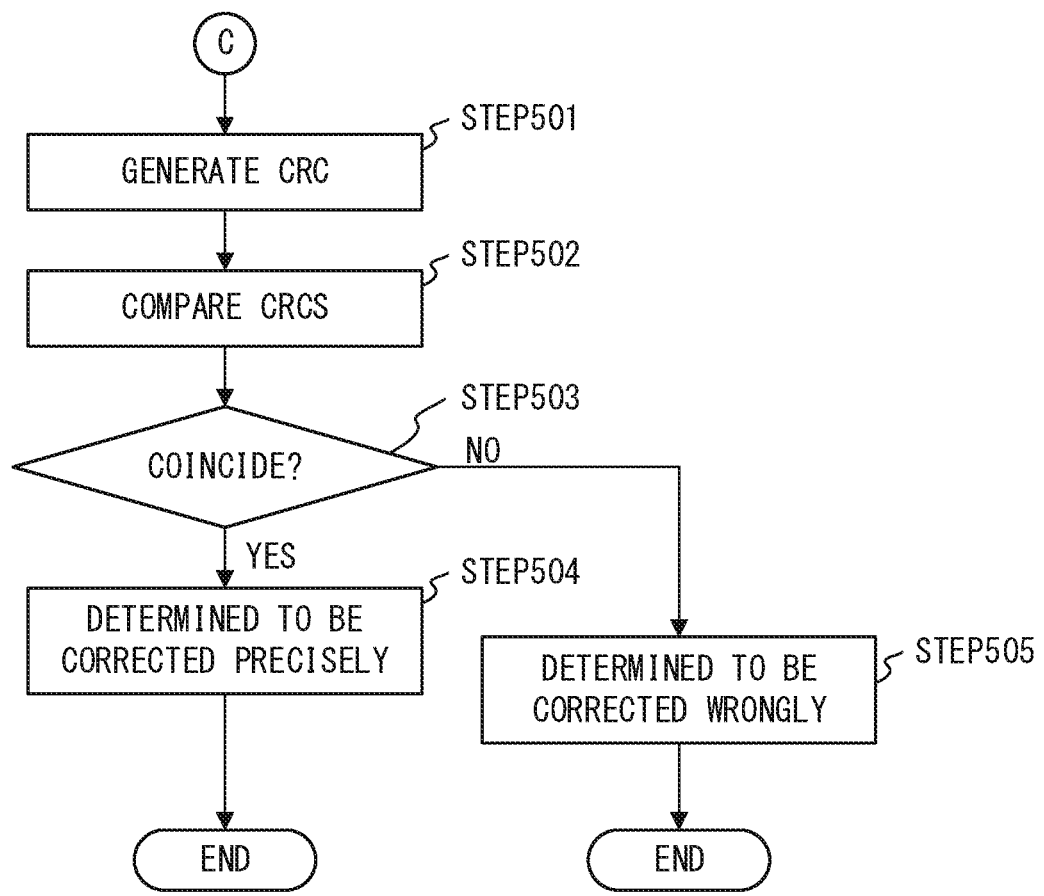
FIG. 8 is a flowchart of the error correction processing routine executed by the semiconductor integrated circuit according to the second embodiment.

FIG. 5 is a drawing illustrating an example of the structure of data stored in the memory 20 according to the present embodiment. The memory 20 stores a 16-byte data portion and a 4-byte CRC (cyclic redundancy check) code corresponding to the data portion, in correspondence with each other. Each of the 16-byte data portion and the 4-byte CRC code is accompanied with a 2-byte parity bit. In the following description, the 4-byte CRC code accompanied with the 2-byte parity bit is referred to as "CRC data".

As described above, in the present embodiment, the 16-byte data portion is accompanied with the 2-byte parity bit, and the 4-byte CRC code is accompanied with the 2-byte parity bit. The error correction circuit 14 according to the present embodiment has the ability to correct 2 bits of errors, as in the case of the first embodiment. Thus, the error correction circuit 14 can correct 2 bits of errors of the 18-byte data. The error correction circuit 14 can also correct 2 bits of errors of the 6-byte CRC data.

Next, the operation of error correction processing performed by the semiconductor integrated circuit 10 according to the present embodiment will be described with reference to a flowchart of FIGS. 6 to 8, FIGS. 9A to 9F and FIG. 10.

The memory controller 11 reads 18-byte data including a 16-byte data portion and a 2-byte parity bit, and 6-byte CRC data including a 4-byte CRC code and a 2-byte parity bit from the memory 20 (STEP 301). The memory controller 11 supplies the read data and the read CRC data to the error correction controller 12. The correction control unit 13 of the error correction controller 12 stores the read data and the read CRC data in the internal memory 15.

The semiconductor integrated circuit 10 performs the same processing as the sequential processing of STEPS 101 to 105 and STEPS 201 to 208 of the first embodiment on the read data. At this time, if coincidence (YES) is determined in STEP 105 or STEP 205, the operation of the semiconductor integrated circuit 10 shifts to a processing step of STEP 303 (STEP 302).

Figure 9A:
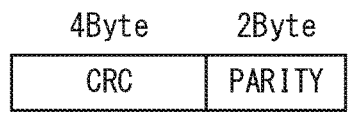
FIG. 9A is a drawing illustrating the structure of a CRC code and a parity bit read from a memory.
Figure 9B:
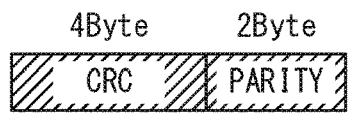
FIG. 9B is a drawing illustrating the CRC code and the parity bit after an error correction.

The correction control unit 13 controls the error correction circuit 14 to perform error correction processing on each of the CRC code and the parity bit of the read CRC data (STEP 303). FIG. 9A illustrates the read CRC code before the error correction. In FIG. 9B, the read CRC data after the error correction is illustrated by shading.

Next, the correction control unit 13 controls the error correction circuit 14 to newly generate, with respect to a CRC code (4 bytes) of the read CRC data after the error correction (hereinafter referred to as corrected CRC data), a 2-byte parity bit corresponding to the CRC code (STEP 304).

Figure 9C:
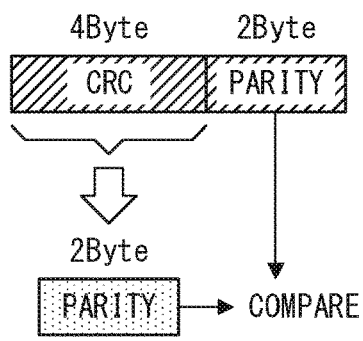
FIG. 9C is a drawing schematically illustrating a state of generating a parity bit on the CRC code after the error correction, and a state of comparing the generated parity bit with the parity bit after the error correction.

The correction control unit 13 makes a comparison between the parity bit newly generated in STEP 304 and the parity bit the error of which is corrected in STEP 303 (STEP 305). In FIG. 9C, the newly generated parity bit is indicated with dots, and the parity bit the error of which is corrected in STEP 303 is indicated with shading.

The correction control unit 13 determines whether or not the two parity bits coincide (STEP 306). When the parity bits are determined to coincide (YES in STEP 306), all errors contained in the read CRC data are determined to be corrected, and the operation of the semiconductor integrated circuit 10 shifts to processing steps illustrated in the flowchart of FIG. 8. On the other hand, when the parity bits are not determined to coincide (NO in STEP 306), it is determined that errors exceeding the correction ability of the error correction circuit 14 (i.e. more than 2 bits of errors in the present embodiment) are present, and the operation of the semiconductor integrated circuit 10 shifts to processing steps illustrated in the flowchart of FIG. 7.

Figure 9D:
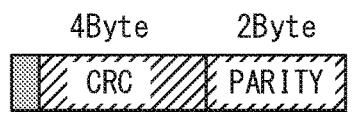
FIG. 9D is a drawing illustrating the CRC code and the parity bit in which the value of one bit is inverted.

The correction control unit 13 inverts the value of a first one bit of the corrected CRC data (STEP 401). FIG. 9D illustrates the corrected CRC data after the reversal of the value of the first one bit.

Figure 9E:
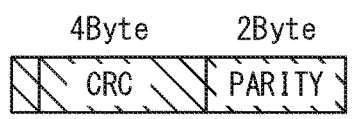
FIG. 9E is a drawing illustrating the data and the parity bit having the one bit of the inverted value after the error correction.

The correction control unit 13 controls the error correction circuit 14 to perform error correction processing on the corrected CRC data after the reversal of the value of the first one bit (STEP 402). FIG. 9E illustrates the CRC data after the error correction in STEP 402.

The correction control unit 13 controls the error correction circuit 14 to newly generate, with respect to a CRC code (4 bytes) of the CRC data after the error correction in STEP 402 (in other words, CRC data after the reversal of the bit and the correction), a 2-byte parity bit (STEP 403).

Figure 9F:
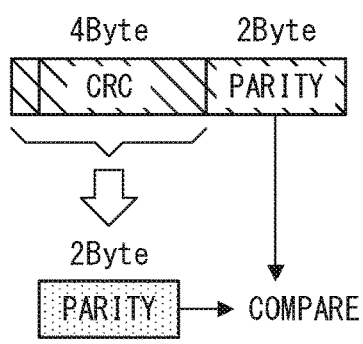
FIG. 9F is a drawing schematically illustrating a state of generating a parity bit on the CRC code after the error correction, and a state of comparing the generated parity bit with the parity bit after the error correction.

The correction control unit 13 makes a comparison between the parity bit newly generated in STEP 403 and the parity bit after the error correction in STEP 402 (STEP 404). In FIG. 9F, the newly generated parity bit is indicated with dots, and the parity bit after the error correction in STEP 402 is indicated with shading.

The correction control unit 13 determines whether or not the two parity bits coincide (STEP 405). When the parity bits are determined to coincide (YES in STEP 405), an error is determined to be corrected in STEP 402, and the operation of the semiconductor integrated circuit 10 shifts to processing steps illustrated in the flowchart of FIG. 8.

On the other hand, when the parity bits are not determined to coincide (NO in STEP 405), the correction control unit 13 repeatedly performs STEP 402 to STEP 405, while shifting a bit the value of which is inverted until the parity bits coincide or the reversal reaches the last bit. In other words, the correction control unit 13 determines whether or not the reversal of bits of the corrected CRC data has proceeded to the last bit (STEP 406). When the reversal of bits has not proceeded to the last bit (NO in STEP 406), the value of the next bit is inverted and STEP 402 to STEP 405 are performed again. When the reversal of bits has proceeded to the last bit (YES in STEP 406), the correction control unit 13 determines that errors cannot be corrected because the number of bits of the errors exceeds the sum of the correction ability of the error correction circuit 14 and one bit corrected by the reversal (in other words, 3 bits in the present embodiment) (STEP 408), and the operation ends.

When the correction control unit 13 determines that the parity bits coincide with each other in each of STEP 306 and STEP 405, a 4-byte CRC code for the 16-byte data portion of the corrected data is newly generated (STEP 501).

Figure 10:
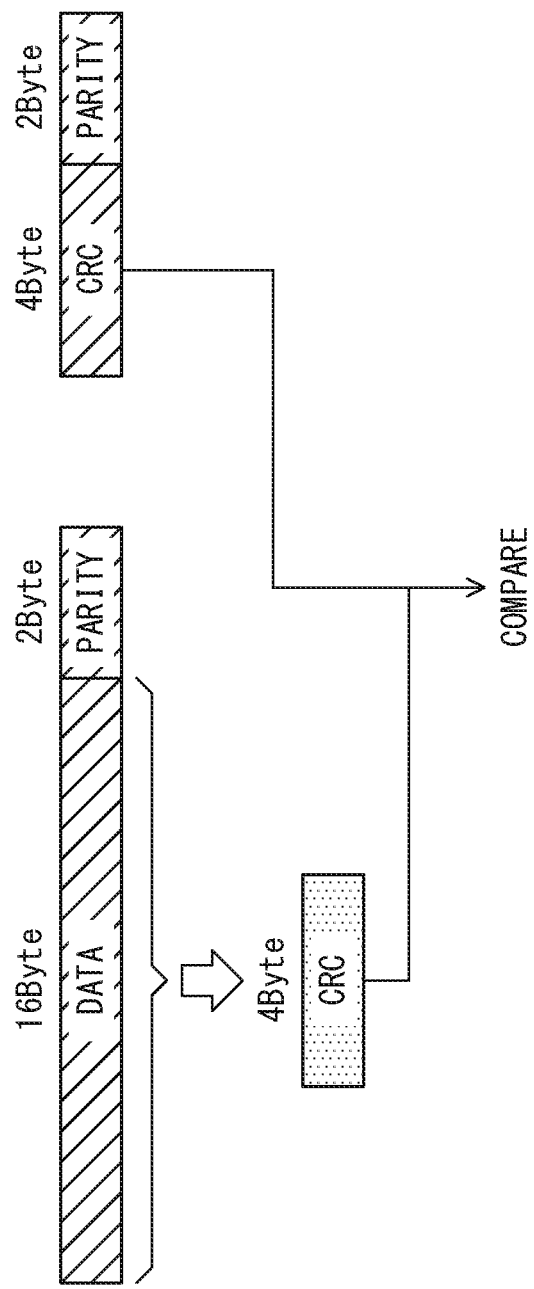
FIG. 10 is a drawing schematically illustrating a state of generating and comparing a CRC code on a data portion after the error correction.

The correction control unit 13 makes a comparison between the CRC code newly generated in STEP 501 and the CRC code the error of which is corrected in STEP 303 or STEP 402 (STEP 502). In FIG. 10, the newly generated CRC code is indicated with dots, and the CRC code the error of which is corrected in STEP 303 or STEP 402 is indicated with shading.

The correction control unit 13 determines whether or not the two CRC codes coincide (STEP 503). When the CRC codes are determined to coincide (YES in STEP 503), all errors contained in all the data and the CRC data are determined to be corrected precisely, and the operation ends (STEP 504).

On the other hand, when the CRC codes are not determined to coincide (NO in STEP 503), the correction control unit 13 determines that a wrong correction has occurred in the error correction processing, and the operation ends (STEP 505).

As described above, the semiconductor integrated circuit 10 according to the present embodiment makes a comparison between the parity bit on which the error correction is performed and the parity bit newly generated on the data after the error correction, and determines whether or not the parity bits coincide with each other, in order to determine whether or not all errors contained in the read data are corrected. When not all errors are determined to be corrected, the error correction is repeatedly performed while the bit value of the data is inverted on a one-by-one basis. According to the processing, even if the data has errors (garbled bits) the number of which exceeds the correction ability of the error correction circuit 14 by one bit, the errors can be corrected precisely. Accordingly, it is possible to correct the bit errors exceeding the correction ability of the error correction circuit, without changing the design of the error correction circuit. As compared with the case of changing the design of the error correction circuit, it is possible to prevent an increase in the size of the circuit.

In the semiconductor integrated circuit 10 according to the present embodiment, the data is accompanied with the CRC code, and the same error correction processing as that performed on the data is also performed on the CRC code. The CRC code after the error correction is compared with a CRC code that is newly generated on the data after the error correction. Whether or not the CRC codes coincide with each other is determined, in order to determine whether or not the error correction is precisely performed. This processing serves to prevent wrong error correction.

It is not limited to the above-described embodiments. For example, the correction control unit 13 may not be a dedicated circuit for performing specific processing, but may be constituted of a CPU (central processing unit) and firmware that control the operation of each component of the error correction controller 12.

The above-described first and second embodiments describe cases in which the error correction circuit 14 performs the error correction using the BCH coding method, but the error correction may be performed in an arbitrary correction method.

In the above-described first and second embodiments, by way of example, the memory controller 11 stores the data read out of the memory 20 in the internal memory 15, but may store the data in an optional memory, such as a RAM (random access memory) or a non-volatile storage medium.

In the above-described first and second embodiments, the original data is stored in the memory 20, but may be stored in an arbitrary storage medium such as a ROM. Otherwise, data received through a device supporting data communication, instead of data stored in the storage medium, may be processed.

In the above-described first and second embodiments, by way of example, the error correction is performed using the 16-byte data and the 2-byte parity bit for error correction, but the data and the parity bit are not limited to these sizes and may have arbitrary sizes. For example, an N-byte (N is an arbitrary natural number) of data and an M-byte (M is a natural number that satisfies M<N) of parity bit may be used.

The above-described first and second embodiments describe cases in which the error correction circuit has the ability to correct 2 bits of errors, but may have the ability to correct an arbitrary different number of errors.

In the above-described embodiment, the value of data is inverted from its front bit on a one-by-one basis, but where to start the reversal is not limited thereto. The reversal may be started from an arbitrary bit position, as long as the value of data is finally inverted at every bit. Instead of on a one-by-one basis, arbitrary n bits (n is a natural number) may be set at one unit. The value of each of the n bits may be inverted in error correction processing, and the error correction processing may be repeatedly performed while the position of reversal is shifted by n bits. For example, in a case where 2 bits constitute 1 unit, if original data is "00", the bits are inverted to "01", "10" and "11", and the error correction processing is performed on each inverted data. Repeatedly performing the same processing, while shifting the position by 2 bits, allows correcting errors that exceeds the correction ability of the error correction circuit by 1 bit, and errors that exceeds the correction ability of the error correction circuit by 2 bits. After the error correction processing is performed with reversal of bits on a one-by-one basis, the error correction processing may be performed with reversal of bits by two-by-two basis. This case also allows correcting errors that exceeds the correction ability of the error correction circuit by 1 bit, and errors that exceeds the correction ability of the error correction circuit by 2 bits. When shifting an inverted bit position, the bit position may be shifted every other bit or every several bits, instead of every sequential bit.

In the above-described second embodiment, the data is accompanied with the 4-byte CRC code, but the CRC code is not limited to this size and may have an arbitrary size.

In the above-described second embodiment, after the error correction processing is performed on the data, the error correction processing is performed on the CRC code. However, the error correction processing may be performed in opposite order or in a concurrent manner.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

What is claimed is:

1. A semiconductor integrated circuit that is connected to a memory that stores data including a data body and a parity bit corresponding to the data body, the semiconductor integrated circuit being configured to read the data from the memory and apply an error correction to the data, the semiconductor integrated circuit comprising:

a memory controller configured to read the data from the memory; and an error correction controller configured to include an error correction circuit having an ability to correct a predetermined number of bits of errors, and to apply an error correction to the data body and the parity bit read from the memory, the error correction controller applying a first error correction to the data body and the parity bit read from the memory, by the error correction circuit, while comparing a generated parity bit with the parity bit to which the first error correction has been applied, and when the generated parity bit does not coincide with the parity bit to which the first error correction has been applied, inverting a value of a first one bit of the data body to which the first error correction has been applied, controlling the error correction circuit to apply a second error correction to the data body and the parity bit to which the first error correction has been applied after the inverting of the value of the first one bit, generating a new parity bit on the data body to which the second error correction has been applied, and determining whether or not errors contained in the data body to which the second error correction has been applied are corrected, on a basis of whether or not the new parity bit coincides with the parity bit to which the second error correction has been applied, wherein when the errors contained in the data body and the parity bit to which the second error correction has been applied are not determined to have been corrected, the error correction controller repeatedly performs the inverting, the controlling, the generating, and the determining, while shifting bit by bit in the data body to a next bit until the inverting reaches a last bit of the data body or until the new parity bit coincides with the parity bit to which the second error correction has been applied.

2. The semiconductor integrated circuit according to claim 1, wherein the memory stores a CRC code body corresponding to the data body, together with the data;

the memory controller reads the data and the CRC code body;

the error correction controller applies an error correction to the data and the CRC code body read from the memory, by the error correction circuit;

the error correction controller generates a new CRC code body on the data body of the data to which the error correction has been applied; and the error correction controller determines whether or not the error correction by the error correction circuit is made precisely, on a basis of whether or not the new CRC code body coincides with the CRC code body to which the error correction has been applied.

3. The semiconductor integrated circuit according to claim 2, wherein
the memory stores CRC code data including the CRC code body and a parity bit corresponding to the CRC code body;
the memory controller reads the CRC code data from the memory;
the error correction controller applies an error correction to the CRC code data read from the memory, by the error correction circuit;
the error correction controller generates a new parity bit on the CRC code body of the CRC code data to which the error correction has been applied;
the error correction controller determines whether or not all errors contained in the CRC code data are corrected, on a basis of whether or not the new parity bit coincides with the parity bit of the CRC code data to which the error correction has been applied; and
when not all the errors contained in the CRC code data are determined to be corrected, the error correction controller applies an error correction by the error correction circuit, while sequentially inverting each bit of the CRC code data.

4. A storage device comprising:
a memory configured to store data including a data body and a parity bit corresponding to the data body;
a memory controller configured to read the data from the memory; and
an error correction controller configured to include an error correction circuit having an ability to correct a predetermined number of bits of errors, and to apply an error correction to the data body and the parity bit read from the memory, wherein
the error correction controller applies a first error correction to the data body and the parity bit read from the memory, by the error correction circuit, while comparing a generated parity bit with the parity bit to which the first error correction has been applied, and
when the generated parity bit does not coincide with the parity bit to which the first error correction has been applied,
inverts a value of a first one bit of the data body to which the first error correction has been applied,
controls the error correction circuit to apply a second error correction to the data body and the parity bit to which the first error correction has been applied after the inverting of the value of the first one bit,
generates a new parity bit on the data body to which the second error correction has been applied, and
determines whether or not errors contained in the data body to which the second error correction has been applied are corrected, on a basis of whether or not the new parity bit coincides with the parity bit to which the second error correction has been applied, wherein
when the errors contained in the data body to which the second error correction has been applied are not determined to have been corrected, the error correction controller repeatedly performs the inverting, the controlling, the generating, and the determining, while shifting bit by bit in the data body to a next bit until the inverting reaches a last bit of the data body or until the new parity bit coincides with the parity bit to which the second error correction has been applied.

5. The storage device according to claim 4, wherein
the memory stores a CRC code body corresponding to the data body, together with the data;
the memory controller reads the data and the CRC code body;
the error correction controller applies an error correction to the data and the CRC code body read from the memory, by the error correction circuit;
the error correction controller generates a new CRC code body on the data body of the data to which the error correction has been applied; and
the error correction controller determines whether or not the error correction by the error correction circuit is made precisely, on a basis of whether or not the new CRC code body coincides with the CRC code body to which the error correction has been applied.

6. The storage device according to claim 5, wherein
the memory stores CRC code data including the CRC code body and a parity bit corresponding to the CRC code body;
the memory controller reads the CRC code data from the memory;
the error correction controller applies an error correction to the CRC code data read from the memory, by the error correction circuit;
the error correction controller generates a new parity bit on the CRC code body of the CRC code data to which the error correction has been applied;
the error correction controller determines whether or not all errors contained in the CRC code data are corrected, on a basis of whether or not the new parity bit coincides with the parity bit of the CRC code data to which the error correction has been applied; and
when not all the errors contained in the CRC code data are determined to be corrected, the error correction controller applies an error correction to the data by the error correction circuit, while sequentially inverting the data value of each bit of the CRC data.

7. An error correction method that is performed by a semiconductor integrated circuit that includes an error correction circuit having an ability to correct a predetermined number of bits of errors, the semiconductor integrated circuit being configured to read data from a memory configured to store the data including a data body and a parity bit corresponding to the data body, and to apply an error correction thereto, the error correction method comprising the steps of:
reading the data from the memory;
applying a first error correction to the data read from the memory, by the error correction circuit, while comparing a generated parity bit with the parity bit to which the first error correction has been applied; and
when the generated parity bit does not coincide with the parity bit to which the first error correction has been applied,
inverting a value of a first one bit of the data body to which the first error correction has been applied;
controlling the error correction circuit to apply a second error correction on the data body and the parity to which the first error correction has been applied after the inverting of the value of the first one bit,
generating a new parity bit on the data body to which the second error correction has been applied; and
comparing the new parity bit with the parity bit on the data to which the second error correction has been applied, to determine whether or not errors contained in the data body to which the second error correction has been applied are corrected;
wherein
when the errors contained in the data body and the parity bit to which the second error correction has been applied are not determined to be corrected, the inverting, the controlling, the generating, and the comparing are repeatedly performed, while shifting bit by bit in the data body to a next bit until the inverting reaches a last bit of the data body or until the new parity bit coincides with the parity bit to which the second error correction has been applied.

8. An error correction method that is performed by a semiconductor integrated circuit that includes an error correction circuit having an ability to correct a predetermined number of bits of errors, the semiconductor integrated circuit being configured to read data and CRC code data from a memory configured to store the data, the data including a data body and a parity bit corresponding to the data body and the CRC code data including a CRC code body corresponding to the data body and a parity bit corresponding to the CRC code body, and to apply an error correction thereto, the error correction method comprising the steps of:

reading the data and the CRC code data from the memory;

applying a first error correction to the data and the CRC code data read from the memory, by using the error correction circuit, while generating a new parity bit on the CRC code body of the CRC code data to which the first error correction has been applied, and comparing the new parity bit on the CRC code body with the parity bit of the CRC code data to which the first error correction has been applied;

inverting a value of a first one bit of the CRC code data to which the first error correction has been applied;

controlling the error correction circuit to apply a second error correction on the CRC code data to which the first error correction has been applied after the inverting of the value of the first one bit;

generating a new parity bit on the CRC code data body of the CRC code data to which the second error correction has been applied; and comparing the new parity bit with the parity bit on the CRC code data to which the second error correction has been applied, to determine whether or not errors contained in the CRC code data to which the second error correction has been applied are corrected;

wherein when the errors contained in the CRC code data to which the second error correction has been applied are not determined to be corrected, the inverting, the controlling, the generating, and the comparing are repeatedly performed, while shifting bit by bit in the CRC code data to a next bit until the inverting reaches a last bit of the CRC code data body or until the new parity bit coincides with the parity bit of the CRC code data to which the second error correction has been applied.

9. The error correction method according to claim 8, wherein the step of applying the first error correction to the data read from the memory, by using the error correction circuit includes the steps of:

applying the first error correction to the data by the error correction circuit;

generating a new parity bit on the data body of the data to which the first error correction has been applied;

comparing the new parity bit with the parity bit of the data to which the first error correction has been applied, to determine whether or not all errors contained in the data are corrected; and when not all the errors contained in the data are determined to be corrected, applying a second error correction to the data by the error correction circuit, while sequentially inverting each bit of the data.

\* \* \* \* \*